(12) United States Patent
Pepin

(10) Patent No.: US 10,665,730 B2
(45) Date of Patent: May 26, 2020

(54) PHOTOVOLTAIC FABRIC WITH WOVEN BUS ARCHITECTURE

(71) Applicant: Karl A. Pepin, Cape Porpoise, ME (US)

(72) Inventor: Karl A. Pepin, Cape Porpoise, ME (US)

(73) Assignee: Pepin Technologies LLC., Cape Porpoise, ME (US)

( * ) Notice: Subject to any disclaimer, the term of this patent is extended or adjusted under 35 U.S.C. 154(b) by 167 days.

(21) Appl. No.: 15/789,110

(22) Filed: Oct. 20, 2017

(65) Prior Publication Data

US 2019/0123212 A1   Apr. 25, 2019

(51) Int. Cl.
| | |
|---|---|
| *H01L 31/02* | (2006.01) |
| *H01L 31/042* | (2014.01) |
| *D03D 5/00* | (2006.01) |
| *H01L 27/30* | (2006.01) |
| *D03D 1/00* | (2006.01) |
| *D03D 13/00* | (2006.01) |
| *H01L 31/0216* | (2014.01) |
| *H01L 31/0352* | (2006.01) |
| *H01L 31/05* | (2014.01) |

(52) U.S. Cl.
CPC ....... *H01L 31/0201* (2013.01); *D03D 1/0076* (2013.01); *D03D 5/00* (2013.01); *D03D 13/004* (2013.01); *H01L 27/304* (2013.01); *H01L 31/02167* (2013.01); *H01L 31/035281* (2013.01); *H01L 31/042* (2013.01); *H01L 31/0508* (2013.01); *D10B 2401/16* (2013.01); *D10B 2401/18* (2013.01)

(58) Field of Classification Search
CPC ........................... H01L 27/304; H01G 9/2086
See application file for complete search history.

(56) References Cited

U.S. PATENT DOCUMENTS

| | | | |
|---|---|---|---|
| 7,622,667 B2 | 11/2009 | Chittibabu et al. | |
| 2005/0081913 A1* | 4/2005 | Ebbesen | D02G 3/441 136/244 |
| 2005/0211294 A1 | 9/2005 | Chittibabu et al. | |
| 2007/0079867 A1 | 4/2007 | Chittibabu et al. | |

(Continued)

FOREIGN PATENT DOCUMENTS

| | | | |
|---|---|---|---|
| CA | 2028154 A1 * | 4/1992 | |
| JP | 60042876 A * | 3/1985 | ..... H01L 31/035281 |

(Continued)

OTHER PUBLICATIONS

Mather et al. Fabrication of Photovoltaic Textiles, Coatings, Apr. 29, 2017, vol. 7(5), pp. 1-21.

(Continued)

*Primary Examiner* — Eric R Smith
(74) *Attorney, Agent, or Firm* — Pearl Cohen Zedek Latzer Baratz LLP

(57) ABSTRACT

A fabric comprising a plurality of photovoltaic filaments includes a conductive bus structure woven into the selvage edge of the fabric, providing a robust and flexible electrical connection from the positive and negative electrode leads of the photovoltaic filaments. The bus structure may be formed in segments which can include any combination of series and parallel configurations to accommodate loads requiring specified voltage and current.

10 Claims, 3 Drawing Sheets

(56) References Cited

U.S. PATENT DOCUMENTS

| | | | |
|---|---|---|---|
| 2009/0103859 A1* | 4/2009 | Shtein | H01L 27/304 385/14 |
| 2009/0139572 A1* | 6/2009 | Gazda | H01L 31/03528 136/261 |
| 2009/0266411 A1 | 10/2009 | Habib et al. | |
| 2012/0192916 A1* | 8/2012 | Wenxu | H01L 31/0201 136/245 |
| 2014/0338721 A1 | 11/2014 | Parent et al. | |
| 2016/0359452 A1 | 12/2016 | Parent et al. | |

FOREIGN PATENT DOCUMENTS

| | | | |
|---|---|---|---|
| WO | WO 2003/065471 | 8/2003 | |
| WO | WO-2011001323 A1 * | 1/2011 | ....... H01L 29/78603 |
| WO | WO-2016126223 A1 * | 8/2016 | ......... H01L 51/4253 |
| WO | WO2016156276 | 10/2016 | |

OTHER PUBLICATIONS

International Search Report for corresponding patent application No. PCT/US2018/044315 dated Nov. 19, 2018.

\* cited by examiner

PHOTOVOLTAIC FABRIC WITH WOVEN BUS ARCHITECTURE

This invention was made with government support under Contract W15QKN-13-9-0001 awarded by the United States Army. The government has certain rights in the invention.

FIELD OF THE INVENTION

The invention relates to a fabric incorporating photovoltaic filaments and particularly to a fabric having an electrical busing architecture woven into the selvage edge of the fabric.

BACKGROUND OF THE INVENTION

A photovoltaic ("PV") device or element, as used herein, means any device incorporating a material that generates electrical current from incident radiation. Current is drawn from the device via the device positive electrode and negative electrode.

Flexible photovoltaic filaments are known in the art, as described for example in Patent Application Publication U.S. 2007/0079867 and U.S. Pat. No. 7,622,667, to Chittibabu, which are incorporated by reference.

While the aforesaid Chittibabu disclosures contemplate incorporating PV filaments into a fabric, to date there has not been a viable means for busing the electrical current generated by a plurality of PV filaments in a fabric, or for incorporating the filaments into a fabric to construct parallel and series circuits to obtain a desired voltage and current.

SUMMARY OF THE INVENTION

Thus, one object of the invention is to provide a flexible and robust bus architecture for a fabric constructed with PV filaments that is native to the fabric structure and which permits interconnection of the fabric filaments in a variety of electrical circuit configurations.

Another object of the invention is to provide a method for weaving a conductive bus structure into the selvage edge of a PV fabric that is robust and flexible.

It is still another object of the invention to provide a method for preparing PV filaments for incorporation into a woven bus structure that prevents short circuits.

These and other objects of the invention are met in one aspect with a woven photovoltaic fabric having opposed first and second edges, comprising: a plurality of non-photovoltaic warp filaments; a plurality of discrete-length photovoltaic weft elements having a clad portion, a positive electrode at a first end of the clad portion, and a negative electrode opposite the positive electrode. A first and second plurality of conductive filaments are woven into the first and second edges of the photovoltaic fabric, respectively, making electrical contact with the positive electrodes and negative electrodes in respective first and second bus structures on opposite edges of the photovoltaic fabric.

In embodiments, each PV weft element comprises a terminated negative electrode protruding from the clad portion of the PV weft element adjacent the unterminated positive electrode and, on the opposite side, a terminated positive electrode adjacent the unterminated negative electrode. To prevent electrical short circuits in the PV fabric, a first insulator may be provided surrounding the unterminated negative electrode and a second insulator may be provided surrounding both a portion of the positive electrode to be terminated and the first insulator surrounding the unterminated negative electrode. "Terminated", in this context, means connected to or connectable to, a terminal, whereas the "unterminated" lead is cut off close to the cladding. A similar electrically insulating structure may be provided on the opposite side of the PV weft element. In particular embodiments, lengths of shrink-fit tubing may be employed as the insulators. It may not be necessary to provide an insulator over both wires if, for example, a liquid polymer is used in an automated process to insulate the unterminated wire. The purpose of the sleeve over both wires is to bind the inner insulator to the bundle so it cannot be pulled off in the weaving process. In cutting the filament to prepare the weft element, one of the electrodes has a coating which, if penetrated, may cause a short with the adjacent electrode. Accordingly, it is preferable to provide insulation on the unterminated electrode.

In another aspect of the invention, a method for making a PV fabric according to the invention comprises: cutting a plurality of discrete length flexible PV filaments to substantially the same length; stripping the outer cladding from opposite ends; cutting off the negative electrode (to be left unterminated) and the positive electrode (to be left unterminated) at opposite ends of the discrete length flexible PV elements and terminating the adjacent positive electrode and negative electrode, respectively, at each end of the photovoltaic element near the cladding. Weaving the PV fabric comprises tensioning a plurality of non-PV warp yarns on a loom and weaving the PV filaments into the warp yarns. Weaving the bus structures of the PV fabric comprises weaving conductive filaments together with the stripped negative electrode and positive electrode leads in the opposed selvage edges of the fabric.

In embodiments, non-conductive yarns are included in both the warp of the selvage edge as fillers, and in the weft between parallel groups of filaments to be joined in series, as separators. Alternatively, or in addition, conductive filaments, such as copper wire, are provided in the warp of the selvage edge, or threaded back and forth in the weft direction between warp-oriented fibers in the selvage edge to form the bus structure. Additionally, conductive filaments threaded back and forth in the weft direction may also act as dimensional fillers, to ensure that the diameter of the weft filaments remains relatively constant across the fabric in the areas stripped of cladding and cut, unterminated positive electrode or negative electrodes.

BRIEF DESCRIPTION OF THE FIGURES

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
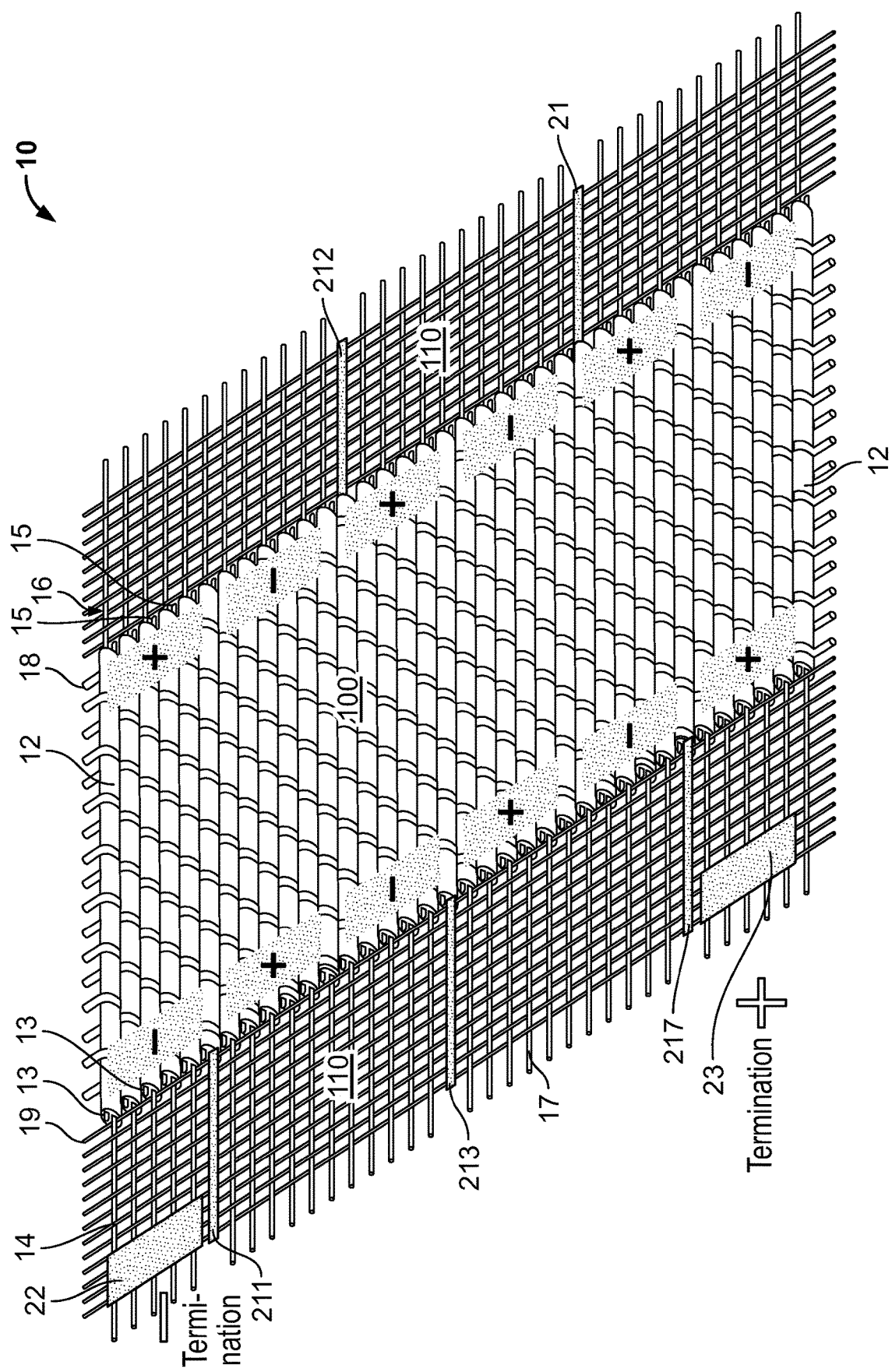
FIG. 1 schematically depicts a PV fabric according to an embodiment of the invention.

The drawings are not to scale, and features not necessary for an understanding of the invention are not shown.

DETAILED DESCRIPTION OF THE INVENTION

The "warp" elements of a fabric, as used herein, refer to the yarns or elements of the fabric held in tension by the loom in the longitudinal direction while the "weft" fibers or elements are inserted through the warp in a transverse direction. As a rolled fabric is taken from a roll, it has two long edges, which may be referred to herein as the "longitudinal edges," "selvage edges" or the "warp-oriented edges" of the fabric, notwithstanding that the length of any particular piece of fabric varies depending on where it is cut. As used herein, "warp" may refer to a direction in the fabric and may also be used to denote the elements oriented in the warp direction as a whole. Likewise, "weft" may be used to denote a direction, or may refer to all the elements in weft orientation in a fabric.

A woven PV fabric according to the invention comprises a PV active area between two selvage edges where the bus structures are formed. To weave the fabric, a plurality of warp yarns are tensioned on a loom and PV filaments are inserted in the weft direction. The PV active area may also include non-PV yarns in the weft, in addition to the PV filaments. The warp yarns in the PV active area in the middle of the fabric and the warp yarns in the selvage edges where the bus structures are formed may be the same or different, and may include natural and synthetic fibers of any type, selected as to tenacity and denier according to end use requirements. The invention is not particularly limited with respect to the non-PV fibers used, although compatibility with the PV filaments as to size should be taken into account so that a reasonably tight weave can be obtained. A translucent fiber may be used in the warp of the PV active area to increase the amount of incident radiation available for photovoltaic conversion. A non-conductive and insulating fiber may be used for the non-PV warp oriented yarns. Non-limiting examples of non-photovoltaic fibers used in the warp include translucent nylon 6,6 fibers, Spectra® brand polyethylene fibers, polyamides such as Kevlar® brand para aramid fibers, cellulosics, cotton, wool, and silk, to name but a few. Any denier fiber may be suitable depending on the weave and end use, for example 100-1000 d. In principle, warp filaments may also comprise photovoltaic filaments, but that may require a separate busing structure on the weft-oriented edge of the fabric.

The plurality of discrete-length PV filaments may be prepared prior to weaving the PV filaments into the weft of the fabric. Each filament constitutes a PV cell, including a positive and negative electrode surrounded by cladding. In embodiments, PV filaments as disclosed in U.S. Pat. No. 7,622,667 are used, comprising a positive electrode wire wrapped around a negative electrode wire, although this is not considered as limiting the invention. Other PV filament configurations comprising a positive electrode, negative electrode and photoactive portion may be known or may become available. To form discrete length PV filaments, a length of cladding may be removed from opposite ends of the PV filament prior to weaving. In certain embodiments, about ¼ inch to about 2 inches or more of cladding may be removed from opposite ends of the PV filament, leaving the positive electrodes and negative electrodes laid bare at each end of the filament. At one end of the filament, the positive electrode is left at its original length and the negative electrode is cut off very near the cladding, to be left insulated and unterminated. At the opposite end of the filament, the negative electrode is left at its original length and the positive electrode is cut off very near the cladding, to be left insulated and unterminated.

By way of example and not limitation, the selvage edges may be ¼ inch to 2 inches or more, and may include non-conductive warp yarns in addition to conductive elements forming the bus structure. Larger sections of fabric may need wider buses for current carrying capacity. The fibers used for the warp in the selvage edge are selected as to size and tenacity for compatibility with conductive filaments forming the bus structure. In embodiments, conductive strands such as gauge 32 or finer copper wire are oriented in the warp direction as part of the conductive bus structure. Copper wire tends to break easily at this fine gauge. Other conductive wires, conductive polymers and/or fibers coated with conductive material may also be used as conductive warp elements without departing from the scope of the invention. Alternatively, or in addition, a fine conductive wire may be passed back and forth in the weft direction (hereinafter "serpentined") through the warp-oriented fibers in the selvage edge of the fabric. Given the fineness of the PV filaments having the cladding removed, an additional conductive wire serpentined through the warp oriented fibers may help ensure a tight weave in the bus structure.

The exposed negative and positive electrodes at the ends of the discrete lengths of PV filament may be modified to prevent the likelihood of short circuits occurring when the end of a cut PV wire negative electrode contacts the positive electrode of the same filament group. For this purpose, an insulator may be applied where the positive electrode and/or negative electrode emerge from the clad portion after the segment is cut, isolating the unterminated lead that has been cut near the cladding from its adjacent lead that will be woven into the bus structure. In embodiments, a first insulator is placed around the unterminated lead. A second insulator may be placed around both the first insulator and around the terminated lead where it emerges from the cladding. In certain embodiments, the first insulator, the second insulator or both are heat-shrinkable polymers placed around the lead and shrunk to fit. In an embodiment, a first length of heat shrink tubing is positioned around the unterminated positive electrode or negative electrode, a second length of heat shrink tubing is placed around the first length of heat shrink tubing and around the terminated lead, and the insulators are shrink fitted, together or in sequence after being applied to the respective leads. A non-limiting example of a suitable shrink-fit tubing suitable for this purpose is Microfit heat-shrinkable tubing available from Tyco electronics. Alternatively, a liquid polymer may be deposited on the respective leads, which may be adapted to a continuous process.

Stripping the negative electrode and positive electrode at opposite ends of the PV filaments creates a spacing problem when the PV fabric is woven, because a tightly woven structure requires an even diameter in the weft filaments, whereas a stripped positive electrode or negative electrode of a PV wire may have a diameter of ¼ to ½ the diameter of clad thickness. For example, and not by way of limitation, a clad, working PV filament cell may have a diameter of 0.016 inches, while the terminated positive electrode or negative electrode may have a diameter of 0.004 inches.

Additional copper filler wire woven into the edge of the fabric may help to create a tight weave, in addition to conducting current as a bus element. Additional cotton fill yarns may also help to improve the tightness of the weave in the bussing structure.

The weave in the PV active area may be different from the weave at the edges of the PV fabric. This is because the filament size is different in both areas and the functional requirements differ in each area. In the conductive bus area, the goal is to create a mechanically robust, electrically sound and flexible bus architecture, including the capability to construct series-parallel circuits within the bus to generate a desired voltage and current from the PV filaments. In embodiments the fabric, including the woven bus structure, may be washable. In embodiments, a plain weave may be used. In embodiments, a twill weave and a basket weave have been found to create a tight weave around the positive electrode and negative electrode filaments where they have a smaller diameter than the clad portion of the PV filaments. Other weaves may be used depending on the end use and requirements of the final fabric.

In one embodiment, a 5 harness satin (5HS) weave was employed in the PV active area. The satin weave was designed to hold the PV filaments proud of the warp yarns and minimize obstruction of incident radiation by the warp filaments. Another satin weave or other weave altogether may be used in the PV active area, depending on the end use that the final fabric will be put to.

Referring to FIG. 1, PV fabric 10 comprises PV active area 100 in the middle and a selvage edge 110 on each opposite warp-oriented edge. PV fabric 10 comprises a plurality of PV filaments 12 with cladding stripped at the ends, exposing terminated positive electrodes 14 and terminated negative electrodes 16 in the selvage edges 110. Terminated leads may extend to the edge of the fabric at 17 and may be finished with an appropriate textile edge finish as known in the art. Unterminated negative electrodes 13 and unterminated positive electrodes 15 are cut close to the cladding (shown in the figure without insulators for clarity). Non-conductive warp yarns 18 may be a translucent and insulating fiber material such as Spectra® brand polyethylene fiber, or translucent nylon 6,6 fibers woven to minimize obstruction of PV filaments 12 in PV active area 100. Non-conductive warp yarns 19 in the selvage edge woven in the same weave as the bus structure may extend beyond the area of stripped cladding to prevent contact between a conductive wire in the selvage edge and unterminated PV filaments. Beyond the non-conductive warp yarns 19, conductive filaments such as copper wire may be used to construct the bus. In embodiments, some 25 copper warp filaments are provided in the conductive bus.

Figure 2A:
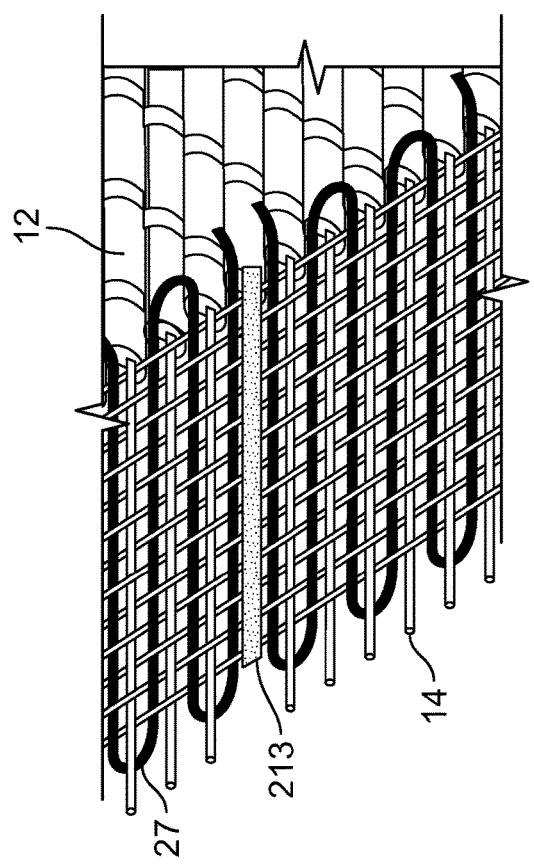
FIG. 2A depicts a selvage edge of a PV fabric according to an embodiment of the invention providing for electrical isolation between adjacent positive electrodes and negative electrodes in groups of parallel cells.
Figure 2B:
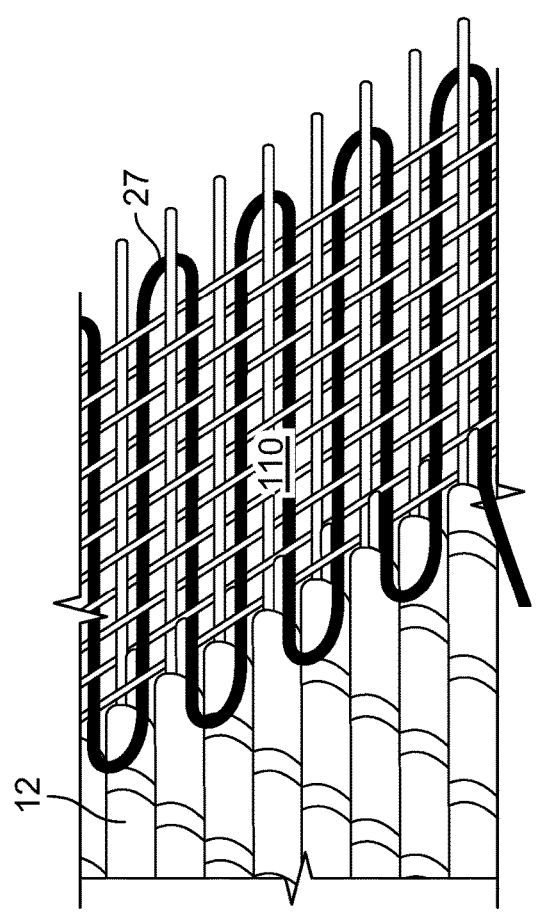
FIG. 2B depicts a selvage edge of a PV fabric according to an embodiment of the invention, wherein electrical continuity is provided between adjacent groups of positive electrodes and negative electrodes.

Additionally, or alternatively, as shown in FIG. 2A and FIG. 2B, copper wire or other conductive filaments 27 may be snaked back and forth ("serpentined") in the weft direction through non-PV warp yarns. In some embodiments, it may be preferable not to have copper or conductive filaments in the warp direction but rather rely upon the serpentined conductive filaments 27 to conduct the bus current. Different yarn(s) may be employed to improve the strength of the extreme edge portion. The outside of the selvage edge may be finished with an appropriate textile finish.

Where copper wire is serpentined through the warp yarns in the selvage edge, loops are formed at the border of the selvage edge and the PV active area. It may be desirable to use tape or adhesive-backed fabric to cover the exposed loops. Serpentined filaments 27 act as conductors and dimensional fillers, rendering the single positive electrode and negative electrode filaments similar in diameter to the clad cells to create a straight tight weave. As shown in FIG. 2A, in the regions of the bus that require electrical isolation between positive electrodes and negative electrodes in parallel cells, the filaments 27 are terminated at the end of each group. As shown in FIG. 2B, in the regions that require electrical continuity between positive electrodes and negative electrodes in parallel cells, the filaments 27 continue from one group to the next.

Figure 3:
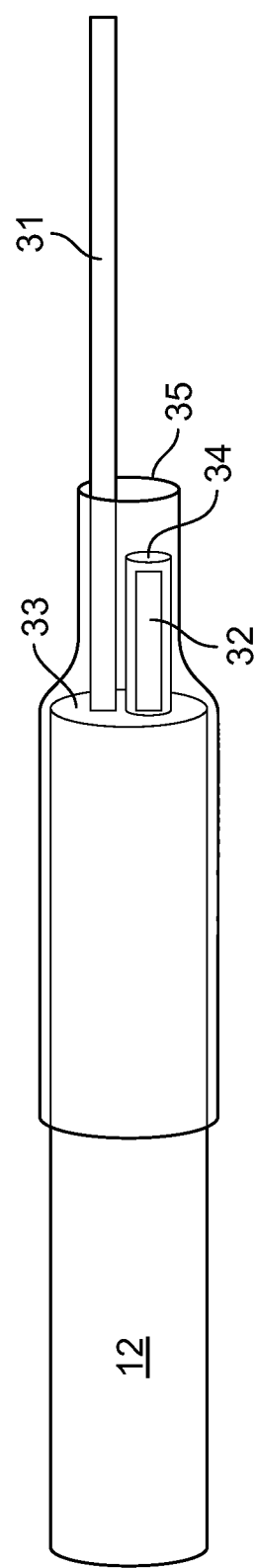
FIG. 3 schematically depicts a PV filament with a stripped cladding at an end thereof and insulation provided around the terminated and unterminated negative electrode and positive electrode.

Insulation may be provided around the terminated and unterminated negative electrodes and positive electrodes as depicted schematically in FIG. 3, according to embodiments of the invention. In FIG. 3, a weft PV element 12 is stripped of cladding 33, and an exposed unterminated positive electrode or negative electrode 32 is cut relatively close to the PV wire. A first insulator 34, which in embodiments may be a length of heat-shrinkable insulative polymer tubing, is provided around the unterminated positive electrode or negative electrode 32. A second insulator 35, which may be a second length of heat-shrinkable polymer tubing may be provided surrounding both the terminated lead 31 and said first insulator. A similar arrangement is provided on the opposite side of the weft PV element, where the other of the positive electrode or negative electrode is unterminated. Alternatively, a liquid polymer application with flush cuts on the unterminated wires may be used to insulate and bind the unterminated wires.

Cuts 21 in the busing structure are illustrated in FIG. 1 as schematic boxes. In some cases, cuts 21 may be physical breaks, for example, where conductive warp filaments are provided along the length of the selvage edge, it may be necessary to cut them to prevent electrical contact from one group of PV filaments to the next. In other cases, cut 21 merely means that the adjacent groups are not electrically connected. In these cases, weft filler yarns may be provided to identify where circuit elements are located, and to separate parallel groups where separate sets of PV filaments form modular circuit components. In the embodiment shown, a first set of PV filaments 12 oriented in parallel in a first direction is attached to a negative electrode terminal pad 22. For example, cut 211 prevents a short circuit of the terminated negative electrode leads with an adjacent set of PV filaments oriented in the opposite direction, having terminated positive electrode leads on the same side of the fabric as the terminated negative electrode leads. The bus structure on the opposite side of PV active area 100 connects the first set of PV filaments in a series connection to a second set of PV filaments, oriented in the opposite direction. Cut 212 prevents a short circuit on that side of the fabric. A second series connection is formed in the fabric between cuts 211 and 213, and so on until the series-multiplied voltage reaches positive electrode pad terminal 23. Colored yarns may be inserted in the area of the cuts (211, 212, 213, 217 etc.) to provide a visual demarcation between modular circuit components. By way of example, and not by way of limitation, several picks of a different colored yarn may be inserted to separate parallel groups and prevent contact (and thus shorts) across the cuts (211, 212, 213, 217), as well as to form tracers identifying different sets of PV elements. A "cut" implies a break in electrical contact and does not require that the fabric actually is cut, though it may be.

The voltage and current output of a given PV element is known, and for a given width of fabric, the output of a given set of PV elements oriented in one direction in the weft may be readily characterized. Moreover, voltage can be summed by attaching sets of parallel PV element groups in series, and current can likewise be summed by attaching sets of PV elements in parallel. Therefore, it is reasonably straightforward for the person of ordinary skill in the art to configure the fabric for a desired current and voltage output. Thus, for a given width of warp, any desired combination of current and voltage outputs can be realized simply by orienting and grouping identical PV filaments as required. A loom can be warped with any length of warp filaments, and multiple pieces of fabric having various voltage and current outputs can be woven without re-warping the loom, which is a time-consuming operation. Additionally, placement of a plurality of positive electrode and negative electrode pad terminals 22, 23 on the selvage edges of the PV fabric may allow multiple fabric voltage or current outputs to be tapped.

The energy output of a PV fabric may be measured by attaching a voltmeter or ammeter between positive electrode pad terminal 22 and negative electrode pad terminal 23. Output will vary depending on the size of the fabric and solar conditions, the number of PV elements incorporated per square foot, and other factors. However, an open circuit voltage ranging upwards of 3.2 V/sq. ft. and short circuit current upwards of 80.0 mA was achieved even with a rudimentary prototype.

Example 1

A total of three hundred (300) feet of 2-stranded PV filament are woven into the weft of a fabric with a PV active area approximately twelve (12) inches in length. The fabric measures approximately eight (8) inches in height. This fabric is configured with six (6) series groups of fifty (50) parallel PV filaments.

The fabric generates approximately sixty (60) mA of DC current at three (3) VDC. It is sewn into a backpack and charges a battery which powers an infrared camera for search and rescue operations.

Example 2

A total of one thousand (1000) feet of 2-stranded PV filament are woven into the weft of a fabric with a PV active area approximately twelve (12) inches in width. The fabric measures approximately twenty-six (26) inches in length. This fabric is configured with ten (10) series groups of one hundred (100) parallel PV filaments. The fabric generates approximately sixty (120) mA of DC current at five (5) VDC. It comprises the back panel of a soldier's uniform and charges batteries for cell phones, radios and computers.

Example 3

A total of ten thousand (10000) feet of 2-stranded PV filament are woven into the weft of a fabric with a PV active area approximately forty-eight (48) inches in width. The fabric measures approximately fifty (50) inches in length. This fabric is configured with ten (10) series groups of two hundred fifty (250) parallel PV filaments. The fabric generates approximately twelve hundred (1200) mA, (or 1.2 A) of DC current at five (5) VDC. It comprises the side panel of a military tent and powers LED lighting, computer tablets and cellular phone chargers.

The description of the foregoing preferred embodiments is not to be considered as limiting the invention, which is defined according to the appended claims. The person of ordinary skill in the art, relying on the foregoing disclosure, may practice variants of the embodiments described without departing from the scope of the invention claimed. A feature or dependent claim limitation described in connection with one embodiment or independent claim may be adapted for use with another embodiment or independent claim, without departing from the scope of the invention.

What is claimed is:

1. A woven photovoltaic fabric comprising a photovoltaic active area, opposed first and second edges on opposite sides of the photovoltaic active area, and further comprising:
    a plurality of non-photovoltaic warp filaments;
    a plurality of discrete-length photovoltaic weft elements, wherein each said photovoltaic weft element has a clad portion in which a positive electrode and a negative electrode are surrounded by a cladding, a terminated positive electrode extending from a first end of the clad portion free of the cladding into the first edge of the fabric, and a terminated negative electrode extending free of the cladding from a second end of said clad portion opposite said terminated positive electrode into the second edge of the fabric, wherein the cladding, the terminated negative electrode, and the terminated positive electrode are not concentric;
    a first and second plurality of conductive elements woven into the first and second edges of the photovoltaic fabric, making electrical termination with said terminated positive electrodes and terminated negative electrodes in respective first and second bus structures on opposite edges of the photovoltaic fabric.

2. The woven photovoltaic fabric according to claim 1, wherein at least one photovoltaic weft element further comprises a length of insulating polymeric material around a portion of an unterminated positive electrode end and a second length of insulating polymeric material around a portion of an unterminated positive electrode end.

3. The woven photovoltaic fabric according to claim 1, wherein each photovoltaic weft element further comprises an unterminated negative electrode adjacent said terminated positive electrode and an unterminated positive electrode adjacent said terminated negative electrode; a first insulator surrounding said unterminated negative electrode and a second insulator surrounding both said terminated positive electrode and said first insulator; a third insulator surrounding said unterminated positive electrode, and a fourth insulator surrounding both said terminated negative electrode and said third insulator.

4. The woven photovoltaic fabric according to claim 1, wherein the photovoltaic active area is between the bus structures on the opposed first and second edges of the fabric and the non-photovoltaic warp yarns and the weft elements are woven in a first weave in the photovoltaic active area that holds the weft elements proud of the warp, and a second weave, different from the first weave in the bus structures on the opposed first and second edges of the photovoltaic fabric.

5. The woven photovoltaic fabric according to claim 1, comprising non-photovoltaic packing fibers in the weft of the fabric, separating adjacent groups of parallel-connected photovoltaic weft elements.

6. The woven photovoltaic fabric according to claim 1, wherein all weft elements in the active area of the fabric consist of said photovoltaic weft elements.

7. The woven photovoltaic fabric according to claim 1, comprising photovoltaic elements in the warp.

8. The woven photovoltaic fabric according to claim 1, wherein the first and second bus structures comprise conductive wires oriented in the warp direction.

9. The woven photovoltaic fabric according to claim 1, wherein the first and second bus structures comprise conductive wires serpentined through non-photovoltaic warp yarns in a weft orientation.

10. The woven photovoltaic fabric according to claim 1, wherein each of the first and second edges of the fabric comprises a first portion comprising a plurality of the terminated positive electrodes, without interspersed terminated negative electrode ends, and an adjacent portion comprising a plurality of the terminated negative electrodes, without interspersed terminated positive electrode ends.

* * * * *